United States Patent [19]
Barringer et al.

[11] Patent Number: 6,106,316
[45] Date of Patent: Aug. 22, 2000

[54] MULTISTAGE CONNECTOR FOR CARRIERS WITH COMBINED PIN-ARRAY AND PAD-ARRAY

[75] Inventors: Dennis R. Barringer, Wallkill; Kathryn M. Cimino; Dennis J. Hafer, Sr., both of Poughkeepsie; Drew R. Horvath, Red Hook; Steven C. Wilson, Hyde Park, all of N.Y.

[73] Assignee: International Business Machines Corporation, Armonk, N.Y.

[21] Appl. No.: 09/249,984

[22] Filed: Feb. 10, 1999

[51] Int. Cl.⁷ .................................................... H01R 13/15
[52] U.S. Cl. ............................................. 439/263; 439/70
[58] Field of Search .................................. 439/70–73, 83, 439/197, 263, 264

[56] References Cited

U.S. PATENT DOCUMENTS

| | | |
|---|---|---|
| 4,358,175 | 11/1982 | Reid . |
| 4,397,519 | 8/1983 | Cooney . |
| 4,422,703 | 12/1983 | Christensen et al. . |
| 4,468,072 | 8/1984 | Sadigh-Behzadi . |
| 4,496,205 | 1/1985 | Christensen et al. . |
| 4,498,725 | 2/1985 | Bright et al. . |
| 4,502,747 | 3/1985 | Bright et al. . |
| 4,636,026 | 1/1987 | Cooney et al. . |
| 4,674,811 | 6/1987 | Corwin . |
| 4,836,798 | 6/1989 | Carter . |
| 4,889,499 | 12/1989 | Sochor . |
| 5,002,499 | 3/1991 | Matsuoka . |
| 5,043,791 | 8/1991 | Stokes et al. ............................. 357/70 |
| 5,057,031 | 10/1991 | Sinclair . |
| 5,092,789 | 3/1992 | Sinclair . |
| 5,107,329 | 4/1992 | Okinaga et al. ......................... 357/74 |
| 5,108,302 | 4/1992 | Pfaff . |
| 5,123,855 | 6/1992 | Petersen . |
| 5,127,837 | 7/1992 | Shah et al. . |
| 5,151,040 | 9/1992 | Tanaka . |
| 5,215,472 | 6/1993 | DelPrete et al. . |
| 5,308,252 | 5/1994 | Mroczkowski et al. . |
| 5,309,324 | 5/1994 | Herandez et al. . |
| 5,376,882 | 12/1994 | Johnson . |
| 5,395,254 | 3/1995 | Mogi . |
| 5,548,223 | 8/1996 | Cole et al. . |
| 5,549,479 | 8/1996 | Elco et al. . |
| 5,609,495 | 3/1997 | McHugh . |

OTHER PUBLICATIONS

*ETT Zero Insertion Rocket*, R.G. Meeker, IBMSystem Products'Division—East Fishill, Technical Report Sep. 2, 1977 edition, pp. i–87.

*Primary Examiner*—Khiem Nguyen
*Attorney, Agent, or Firm*—DeLio & Peterson, LLC; Peter W. Peterson; Aziz M. Ahsan

[57] ABSTRACT

A socket for connecting to an integrated circuit module containing pin grid array contacts and land grid array contacts thereon. The socket has a first portion containing openings therein for the pin grid array contacts and a second portion for contacting the land grid array contacts. The first portion of the socket is disposed around the second portion of the socket, and the second portion is movable with respect to the first portion. The second portion is located in a position wherein the pin grid array contacts on the integrated circuit module are received in the openings in the first portion before the land grid array contacts on the integrated circuit module contact the second portion, the second portion being biased toward the integrated circuit module by a spring. The socket further includes movable connectors in the openings in the first portion of the socket for releasably securing the pin grid array contacts, such that the pin grid array and land grid array contacts on the integrated circuit module are simultaneously in contact with the respective portions of the socket. The connectors comprise leaf connectors movable in a direction lateral to the pin grid array contacts to open while receiving the pin grid array contacts and close to secure the pin grid array contacts in the openings. Inflatable bladders are employed to simultaneously move the leaf connectors between the open and closed positions.

28 Claims, 8 Drawing Sheets

MULTISTAGE CONNECTOR FOR CARRIERS WITH COMBINED PIN-ARRAY AND PAD-ARRAY

BACKGROUND OF THE INVENTION

1. Field of the Invention

This invention relates to electronic sockets, and more particularly, to electronic circuit module test sockets for temporarily contacting modules with a combination of pins and pads on the bottom surface that must be contacted simultaneously.

2. Description of Related Art

In the process of manufacturing multi-chip integrated circuit (IC) modules, it is necessary to temporarily make contact to the electrical interface connections (commonly called "pins" or "I/Os") for the purpose of characterization and test. As these devices have become increasingly more dense and complex, the number of I/O connections to a system have also increased, to the point of some multichip modules having hundreds or even thousands of I/Os. Earlier devices with fewer I/Os often had these I/Os arranged around the periphery of the package, and they were easily placed into and removed from a socket with a reasonable amount of force. The more complex devices now have large area arrays of contacts, and the forces required to insert and remove a device have become considerable, with increased risk of damage to the device, contact socket, or tester interface board.

This problem led to the development of low-insertion-force (LIF) and zero-insertion-force (ZIF) sockets for devices with pins (Pin Grid Array or PGA), and spring contact compression sockets for devices without pins (Land Grid Array or LGA). The prior art includes many different implementations of these two general contacting methods, each implementation having certain advantages and disadvantages for a particular contacting situation.

Some examples of prior art zero insertion force (ZIF) sockets for contacting PGA devices are found in U.S. Pat. No. 5,057,031 to Sinclair; U.S. Pat. No. 4,468,072 to Behzadi; U.S. Pat. No. 4,674,811 to Corwin; U.S. Pat. No. 4,836,798 to Carter; U.S. Pat. No. 4,889,499 to Socher; U.S. Pat. No. 5,123,855 to Peterson; U.S. Pat. No. 5,002,499 to Matsuoka; U.S. Pat. No. 4,498,725 to Bright et al.; U.S. Pat. No. 5,609,495 to McHugh; U.S. Pat. No. 5,092,789 to Sinclair; U.S. Pat. No. 5,108,302 to Pfaff; U.S. Pat. No. 4,496,205 to Christensen et al.; and U.S. Pat. No. 4,422,703 to Christensen et al. These sockets, while suitable for their intended use, cannot contact a module with both pins and pads incorporated in the module design.

Some examples of prior art spring contacts and sockets with arrays of spring contacts for contacting LGA devices are found in U.S. Pat. No. 4,502,747 to Bright et al.; U.S. Pat. No. 5,215,472 to DelPrete et al.; U.S. Pat. No. 4,636,026 to Cooney et al; U.S. Pat. No. 5,127,837 to Shah et al; U.S. Pat. No. 4,397,519 to Cooney; U.S. Pat. No. 5,151,040 to Tanaka; and U.S. Pat. No. 4,358,175 to Reid. These contacts and sockets, while suitable for their intended use, cannot contact a module with both pins and pads incorporated in the module design.

An example of a prior art socket that is configurable for either PGA or LGA (by exchanging some component parts) is found in U.S. Pat. No. 5,395,254, Mogi. While this socket contacts PGA and LGA, it cannot contact both simultaneously, and is also not suitable for a large number of contacts.

A specific design ZIF socket for PGA modules with many pins having some unique properties is described by R. G. Meeker of IBM East Fishkill, N.Y. in IBM Technical Report No. TR22.2141, "ETT Zero Insertion Socket".

Commercially available contacting sockets do not provide any suitable solutions to the aforementioned problems.

Bearing in mind the problems and deficiencies of the prior art, it is therefore an object of the present invention to provide a system to provide repeatable electrical continuity simultaneously between an IC with different I/O arrays and a load board attached to a test system or any other electrical peripheral devices.

It is another object of the present invention to provide such a system which also performs all the critical components of any IC interconnect contact, i.e., actuation, alignment, retention and release.

A further object of the invention is to provide such a system which also includes easy reparability of individual contacts for the different contact parts of the socket.

It is yet another object of the present invention to provide an assembly for connecting an IC to a load board which permits simultaneous connection of the test connectors on the IC and the production I/O pins, with zero or low insertion force.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus for securing a connection between an integrated circuit module containing at least two different contacts thereon and a circuit board. The apparatus comprises a socket for receiving first and second sets of the contacts on one side thereof, the first set of contacts being different than the second set of contacts. A first portion is of the socket contains openings therein for the first set of contacts. A second portion of the socket is adapted to contact the second set of contacts. The second portion is movable with respect to the first portion. The second portion is located in a position wherein the first set of contacts on the integrated circuit module contact the openings in the first portion before the second set of contacts on the integrated circuit module contact the second portion. The second portion is biased, for example, by a spring, toward the integrated circuit module. Movable connectors in the openings in the first portion of the socket releasably secure the first set of contacts in the openings. The second portion of the socket maintains contact with the second set of contacts such that the first and second set of contacts on the integrated circuit module are simultaneously in contact with the respective portions of the socket.

Preferably, the first portion of the socket contains openings therein for a first set of pin grid array contacts on the integrated circuit module and the second portion of the socket contains contacts thereon for a second set of land grid array contacts on the integrated circuit module. Also, in the preferred embodiment the first portion of the socket containing openings is disposed around the second portion of the socket.

The connectors may be zero or low insertion force connectors and may comprise leaf connectors movable in a direction lateral to the first set of contacts to open while receiving the first set of contacts and close to secure the first set of contacts in the openings. Inflatable bladders may be used to simultaneously move the leaf connectors between the open and closed positions.

It is preferred that the socket second portion is movable in a direction toward and away from the integrated circuit module such that forces on the second set of contacts are maintained solely in the direction of movement of the second portion while the first set of contacts is maintained in the openings.

The socket may have a second side opposing the one side for contact with the circuit board, wherein the second side has a third portion of the socket containing movable connectors in openings for releasably securing a set of contacts on the circuit board and a fourth portion of the socket for contacting another set of contacts on the circuit board. The movable connectors in the third portion of the socket may be the same as the movable connectors in the first portion of the socket. In such embodiment, the first and third portions of the socket contain openings therein for a set of pin grid array contacts on the integrated circuit module and the circuit board, respectively, and the second and fourth portions of the socket contain similar contacts thereon for connection to the integrated circuit module and the circuit board, respectively.

In the apparatus of the present invention, the openings in the first portion of the socket may include a shoulder and wherein the movable connectors are received in the openings such that a portion on each of the connectors abuts the shoulder, the shoulder restricting movement of the connector completely through the opening.

In a related aspect, the present invention provides a socket for connecting to an integrated circuit module containing pin grid array contacts and land grid array contacts thereon. The socket has a first portion containing openings therein for the pin grid array contacts and a second portion for contacting the second set of contacts. The second portion is movable with respect to the first portion. The second portion is located in a position wherein the pin grid array contacts on the integrated circuit module and are received in the openings in the first portion before the land grid array contacts on the integrated circuit module contact the second portion, the second portion being biased toward the integrated circuit module by, for example, a spring. The socket further includes movable connectors in the openings in the first portion of the socket for releasably securing the pin grid array contacts, such that the pin grid array and land grid array contacts on the integrated circuit module are simultaneously in contact with the respective portions of the socket. Preferably, the first portion of the socket contains openings is disposed around the second portion of the socket.

The connectors may comprise leaf connectors movable in a direction lateral to the pin grid array contacts to open while receiving the pin grid array contacts and close to secure the pin grid array contacts in the openings. Inflatable bladders may be employed to simultaneously move the leaf connectors between the open and closed positions.

Preferably, the contacts on the second portion comprise pointed barbs and the second portion is movable in a direction toward and away from the integrated circuit module such that forces on the land grid array contacts are maintained solely in the direction of movement of the second portion while the pin grid array contacts are maintained in the openings in the first portion.

In another aspect, the present invention provides a method of securing a connection between an integrated circuit module containing at least two different contacts thereon and a circuit board. The method comprises providing an integrated circuit module having a first set of contacts and a second set of contacts, the first set of contacts being different than the second set of contacts and providing a socket on a circuit board having a first portion containing openings therein for the first set of contacts and a second portion for contacting the second set of contacts. The socket second portion is movable with respect to the first portion. The second portion is located in a position wherein the first set of contacts on the integrated circuit module contact the openings in the first portion before the second set of contacts on the integrated circuit module contact the second portion, with the second portion being biased toward the integrated circuit module. The method then comprises moving the integrated circuit module toward the socket to begin insertion of the first set of contacts into the openings in the first portion without permitting the second set of contacts to contact the socket second portion. Thereafter contact is made between the second set of contacts on the integrated circuit module and the second portion of the socket while continuing to move the first set of contacts into the openings. Then, the method includes securing the first set of contacts in the openings to maintain simultaneous contact between the first and second set of contacts on the integrated circuit module and the respective portions of the socket.

Preferably, the openings in the first portion of the socket provide zero or low insertion force. The first portion of the socket may include leaf connectors in the openings movable in a direction lateral to the first set of contacts and including opening the leaf connectors while moving the first set of contacts and closing the leaf connectors to secure the first set of contacts in the openings.

The socket may include inflatable bladders to move the leaf connectors between the open and closed positions and the method may include inflating the bladders to close the leaf connectors to secure the first set of contacts in the openings, preferably simultaneously inflating the bladders to move the leaf connectors between the open and closed positions.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–14 of the drawings in which like numerals refer to like features of the invention. Features of the invention are not necessarily shown to scale in the drawings.

The present invention is preferably utilized for connecting a multi-chip integrated circuit module to be tested, also known as a device under testing (DUT), to a circuit board. The preferred connector assembly of the present invention may be utilized with multi-chip module configurations which have the dual requirements of, first, access to internal connections between various circuit dies or chips on the module; and, second, a physical input/output (I/O) pin arrangement on the bottom surface of the module that corresponds to an existing socket design in a computer system. The multistage connector assembly does not require an increase in the number of I/O pins on the module or change in the layout, spacing or signal pin assignments, but, at the same time, provides electrical contact access to the internal circuit nodes for the purpose of a manufacturing test. Access to the internal test points of the multi-chip module is generally not required after such a manufacturing test.

The preferred fixed arrangement for receiving chip I/O pins, such as a pin grid array (PGA), generally occupies the outer perimeter of a square multistage connector assembly, accommodating several rows of the pins. There are typically no pins occupying the central area of a chip, so this area may be utilized to provide an area array of pads (LGA) within the PGA outline. These LGA pads may then be wired to the internal test points of the multi-chip module as required for testability. Thus the multistage connector assembly of the present invention satisfies both requirements for manufacturing test and system application.

In order to properly test this module, the multistage connector assembly or socket connects the pin array and pad array simultaneously for connection to the tester circuit board. In particular, the multistage connector assembly is adapted to repeatedly interface an integrated circuit (IC) carrier with both land grid array (LGA) and pin grid array (PGA) connectors simultaneously to a fanout platform, for example a load board, electrical interface, or other testing circuit board, for an electrical verification or utilization of the IC devices. The preferred embodiment contains multiple styles of springs imbedded into arrays fashioned to mate with the LGA and PGA matrices on the IC carrier.

The primary actuation connects the LGA to a load board by applying a normal force through the carrier onto imbedded, gold-plated, pointed, beryllium copper springs. The force presses the IC against the pointed barbs causing an internal, compliant spring to deflect. The path of electrical continuity between each LGA pad and the internal planes of a load board is through the pointed barb, spring, spring case and soldered via. The pointed springs are imbedded (press-fit) into a three piece, precision, non-metallic tower. The pointed barb assembly may be replaced using commonly available tools simplifying repairs.

The secondary actuation connects the PGA to the load board by applying lateral forces on two opposing sides of imbedded, gold-plated, dual leaf, beryllium copper springs. The forces pinch the two leaf springs against opposing sides of each pin, providing redundant contact points and equalizing the total force experienced by the packaged IC device. The path of electrical continuity between each PGA pin and the internal planes of the load board is through the dual leaf spring contact, the load board pin, and soldered via. The four-beam leaf springs are imbedded (slip-fit) into a five-layer plate assembly. Each leaf spring may be replaced using commonly available tools, simplifying repairs.

The IC carrier aligns to the connector mechanism via a non-conductive locator-holding plate which captures each pin of the PGA into a tapered via. The LGA pads are immediately in the proper position and location. The PGA pins drop down into the open leaf springs upon compression of the LGA spring deflection with zero insertion force (ZIF) inflicted on the pins. Metallic pins of accurate diameter are employed throughout the connector assembly to insure alignment between the load board, spring contact arrays, and the locator-holding plate. The two metallic pins reside (press-fit) in the open pocket stiffener plate behind the load board and pass through (slip-fit) each critical component of the interconnect mechanism.

The IC carrier can be placed into the locator-holding plate by either an automatic loader or by a manual loader. The locator-holding plate maintains the positions of the IC carrier during the spring actuations preventing transverse pad damage, e.g., scratches, to the LGA and throughout the entire IC electrical verification.

The two actuations, i.e., initially normal forces and then lateral forces, are both produced by introducing pressurized air into the assembly. The pneumatic controls can be performed manually, or interfaced with an automatically programmable controller. The carrier is held into the connector by secondary actuation (lateral forces) regardless of the load board orientation—vertical, horizontal or anywhere in between.

The normal actuation can be implemented with a variety of mechanisms. One typical generator is the pneumatic air cylinder mounted directly to the locator-holding plate or mounted inside an automatic handler.

The lateral actuation may be generated by a series of captivated, expandable air tubes adjacent to the associated pusher plate which acts upon one side of the leaf springs. An opposing set of air tubes reside adjacent to the opposing pusher which acts upon the opposite sides of the leaf springs. The air tubes expand upon introduction of pressurized air, forcing the pushers against the leaf spring actuators, thus pinching the springs onto the PGA pins.

The carrier may be released from the connector mechanism with zero retraction force (ZRF). No external force or tools are required for removal of the carrier from the locator-holder plate because the springs fully open and retract upon deactivation of the pressurized air. The connector is normally open such that the dual leaf springs open away from the PGA releasing the pins allowing the carrier to float to an established balance on the barbed springs.

Figure 1:
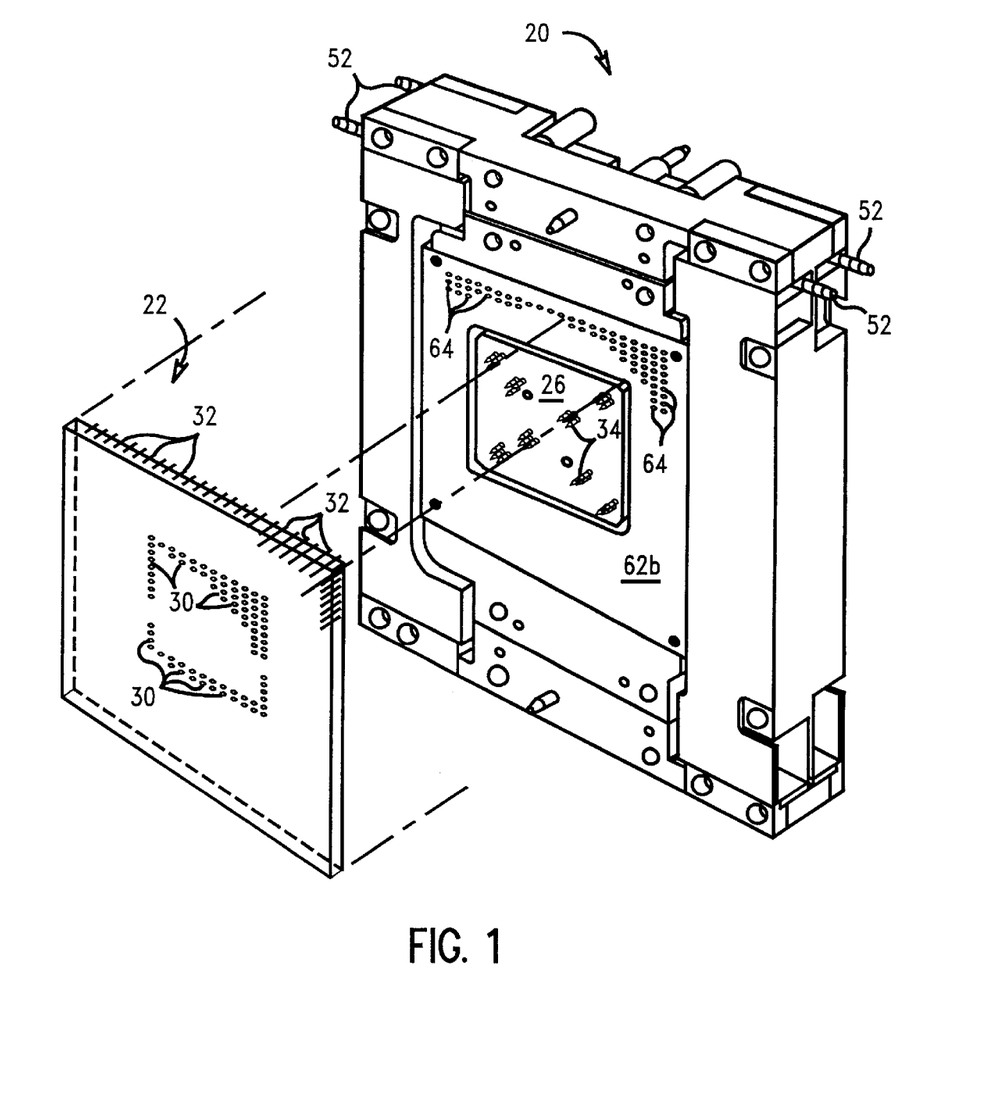
FIG. 1 is a perspective view of the preferred multistage connector assembly of the present invention and an IC carrier.
Figure 2:
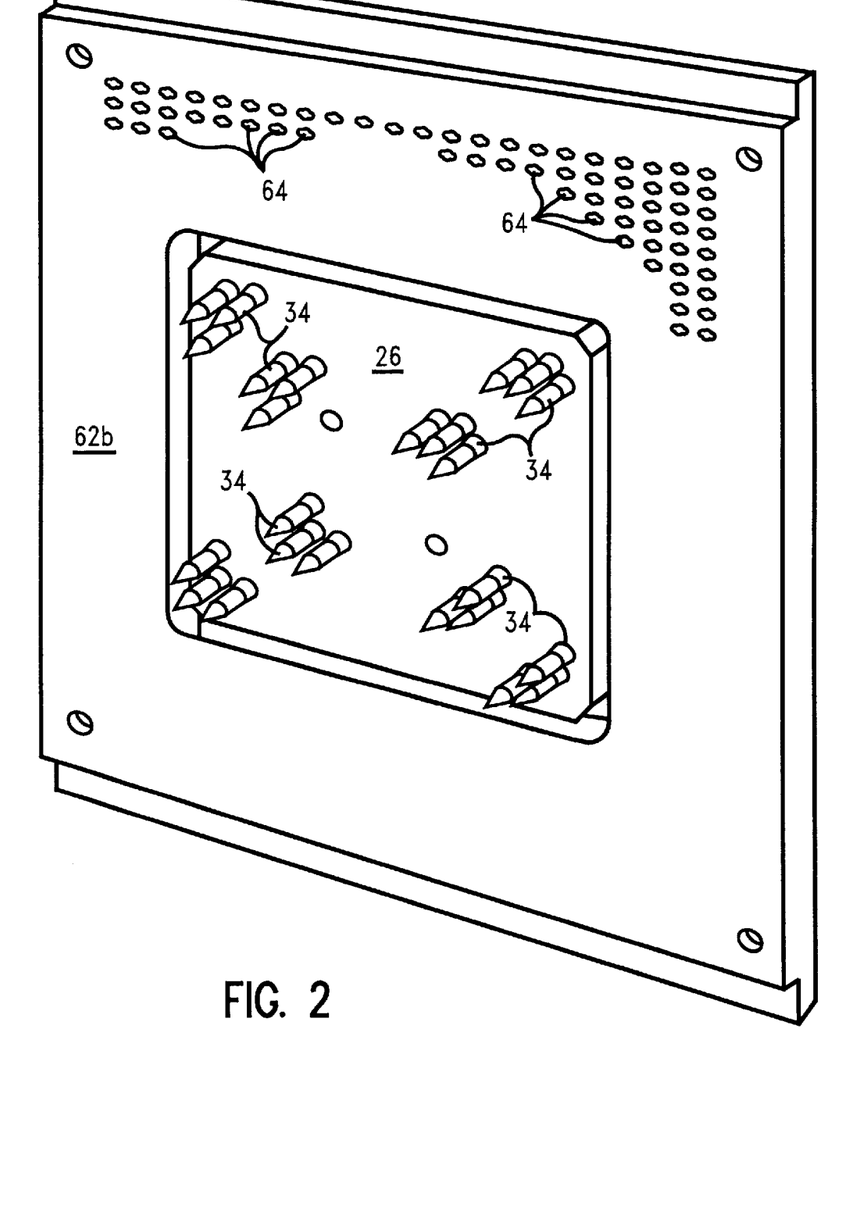
FIG. 2 is a perspective view of the zero insertion force and imbedded spring tower connector portions of the carrier of FIG. 1 showing where the electrical connection to the IC carrier is made.
Figure 10:
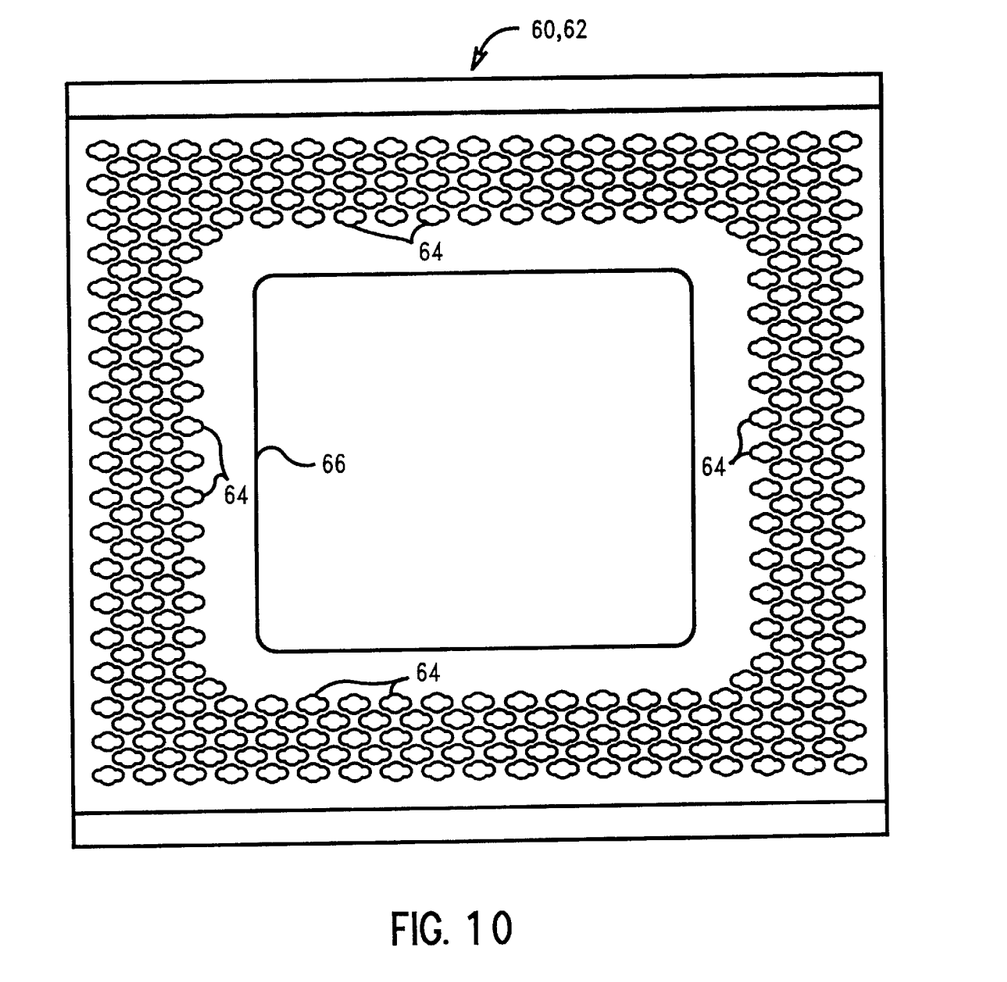
FIG. 10 is a top plan view of the preferred actuator plate utilized in the multistage connector assembly of FIG. 1.

As shown in FIG. 1, a multistage connector assembly 20 is adapted to make electrical connection to an IC carrier or DUT 22. The DUT 22 contains two physically different types of connections—PGA connector pins 32 for use in the production version of the IC carrier and LGA pads 30 for internal test connections only. The PGA and LGA connections are made simultaneously, for the purposes facilitating IC carrier test. As shown more clearly in FIGS. 2, 3, 5, 6 and 8, springs pins 34 extend from the central portion of the connector assembly on spring tower 26 for electrical contact with LGA pads 30 on DUT 22. Otherwise conventional pogo-type spring contacts on a fine pitch of, for example, 0.050 inches assembled in a modular insert block may be employed. Spring tower 26 is biased by springs within a plurality of pins 34 toward DUT 22. Disposed around spring tower 26 is actuator plate 62b containing ZIF or LIF openings 64 for receiving and making electrical contact with PGA connectors 32. Only a portion of the actual number of openings 64 are shown in FIGS. 1 and 2—the preferred distribution of openings 64 around tower 26 is shown in FIG. 10. A removable face plate 28 containing openings 36 corresponding to openings 64 may be placed over actuator plate, as shown in FIG. 3.

Multistage connector 20 also houses pneumatic actuation drive assemblies used to close contacts about the PGA, hardware for aligning the connector to the test tool, and other framework and support hardware, as will be described in more detail below.

The surface or face of spring tower 26 is depressed with respect to ZIF face plate 28, and is also isolated from the ZIF array at the point of contact. The height differential between the tips of spring contacts 34 and the ZIF face plate is configured with respect to the DUT configuration so as to permit for DUT pins 32 to engage the face plate 28, which acts as a locator and holder plate, and become aligned with the ZIF or LIF connectors therein prior to contact between DUT LGA connectors 30 and spring pins 34 on spring tower 26. This is shown in FIGS. 3 and 5. This sequence assures not only proper alignment of spring contacts 34 to the DUT, but also assures that only forces normal to the LGA are applied via spring contacts 34. As the ZIF connections for the PGA connectors do not exert any net lateral forces to the part upon contacting the PGA, the distinctly normal forces exerted on the LGA are maintained throughout the test cycle. The connector segments 26 and 28 are isolated at the DUT connection level for electrical reasons, but anchored at the tester load board to achieve consistent mechanical alignment across the connector assembly. Mechanical isolation at this level also allows for greater customization and versatility of the connector against different IC carrier physical I/O configurations.

Figures 3, 4, 5:
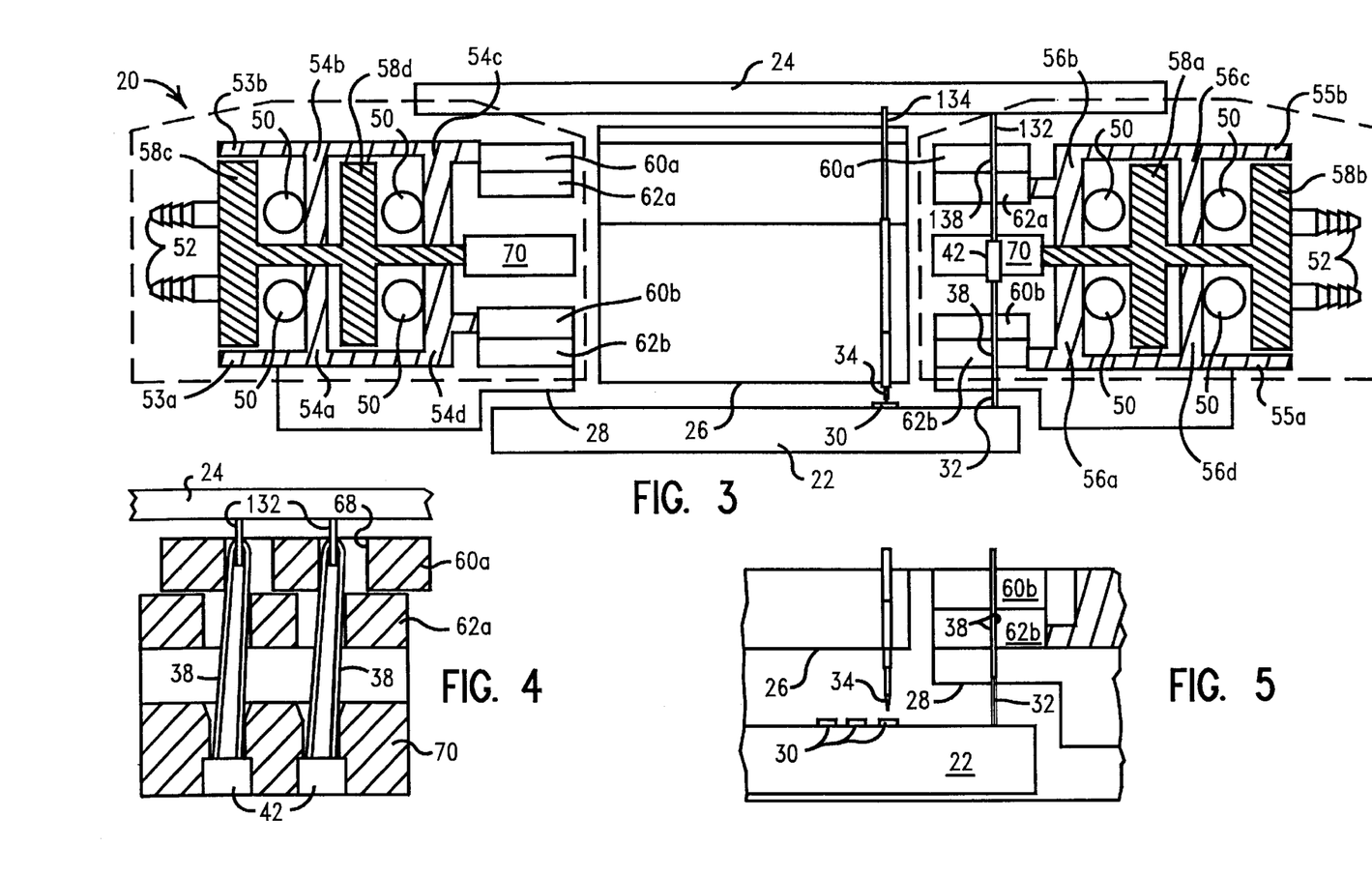
FIG. 3 is an elevational sectional view of the connector assembly of FIG. 1 between an IC carrier connected on one side and a circuit board on the other side.
FIG. 4 is an enlarged elevational sectional view of a portion of the connector assembly of FIG. 3 showing the pin grid array connector to the circuit board.
FIG. 5 is an enlarged elevational sectional view of a portion of the connector assembly of FIG. 3 showing the pin grid array and land grid array connectors to the IC circuit after contact with the PGA connectors and prior to contact with the LGA connectors.

FIG. 3 also depicts connection of a load or test circuit board 24 to spring tower pin connectors 134. Each spring tower pin connector 134 is the opposite end of spring pin connector 34, which connects to circuit board module or DUT 22. Such connection between the spring tower and circuit board may be removable or, more preferably, is secured such as by soldering each of a plurality of spring pins 134 to the corresponding connectors on circuit board 24. FIG. 4 depicts the connection of PGA pins 132 on load board 24 to the ZIF connectors 38 in the multistage connector assembly 20, in the same manner as DUT PGA pins 32. Pins 132 may also be soldered to board 24.

Figure 6:
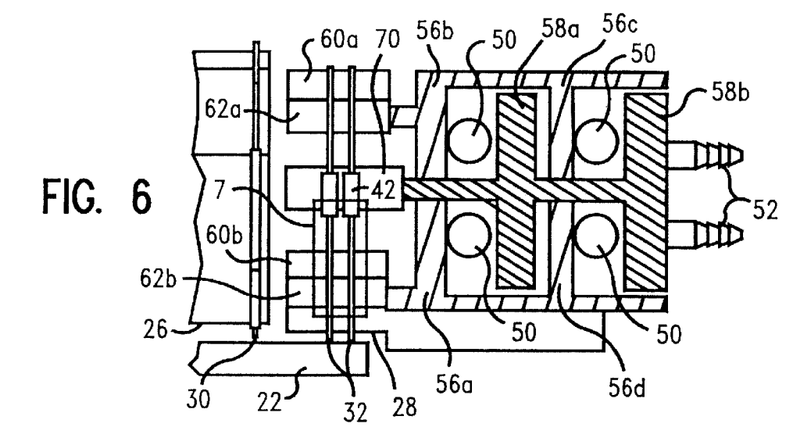
FIG. 6 is an enlarged elevational sectional view of a portion of the connector assembly of FIG. 3 showing the pin grid array and land grid array connectors to the IC circuit prior to actuation of the ZIF connectors.
Figure 7:
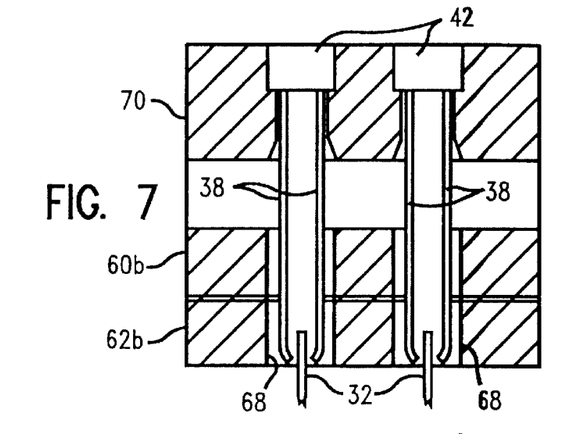
FIG. 7 is an enlarged elevational sectional view of a portion of FIG. 6 showing the ZIF and PGA connectors to the IC circuit prior to actuation of the ZIF connectors.

After the DUT LGA pads have engaged spring pins 34 on spring contact tower 26 and the DUT is fully seated against ZIF face plate 28 as shown in FIG. 6, the ZIF actuation mechanism is used to connect to PGA pins 32 on the DUT. The ZIF connectors which permit zero or low insertion force connection to the PGA pins 32 consist of a contact body 42 form which extend in opposing directions a pair of leaf spring connectors 38. One set of leaf spring connectors 38 extends toward the DUT for capturing PGA pins 32 and the other set of leaf spring connectors extends toward the load board for capturing PGA pins 132. As shown in FIGS. 3, 4, 6–9, and more particularly in FIGS. 12–14, ZIF contact body 42 is received in a slip fit in an opening 46 in contact holder plate 70. A larger diameter head portion 44 on the contact body abuts a corresponding shoulder 48 in opening 46 to prevent contact body 42 from slipping completely through the opening. Openings in drive plates 60a, b and 62a, b permit easy interchanging of the ZIF connectors.

The actuation mechanism for the ZIF connectors consists of contact actuation or drive plates 60a, 60b, 62a, 62b, actuation pusher plates 54a–d, 56a–d, air bladders 50, and air ports 52 for delivering or removing air to or from the bladders. Pusher plates 54a and 54d are connected by, and integrally formed with, plate 53a, pusher plates 54b and 54c are connected by, and integrally formed with, plate 53b, pusher plates 56a and 56d are connected by, and integrally formed with, plate 55a, and pusher plates 56b and 56c are connected by, and integrally formed with, plate 55b. Stationary base plate portions 58a, 58b, 58c and 58d are integrally connected as shown in FIG. 3 and secure ZIF holder plate 70 in a fixed position.

Figure 11:
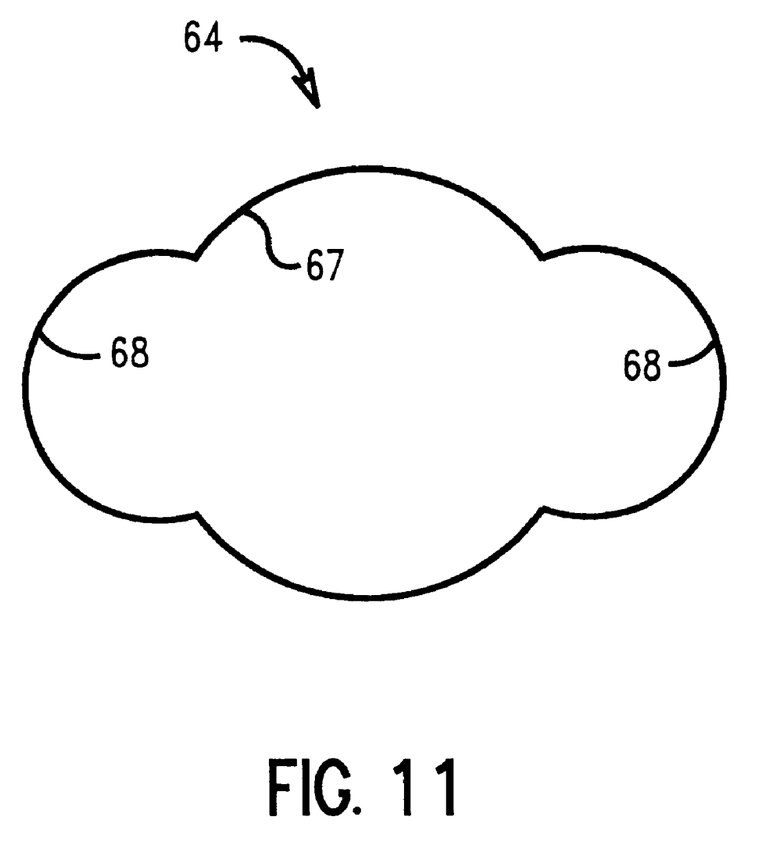
FIG. 11 is an enlarged top plan view of the ZIF connector opening of the actuator plate of FIG. 10.
Figure 12:
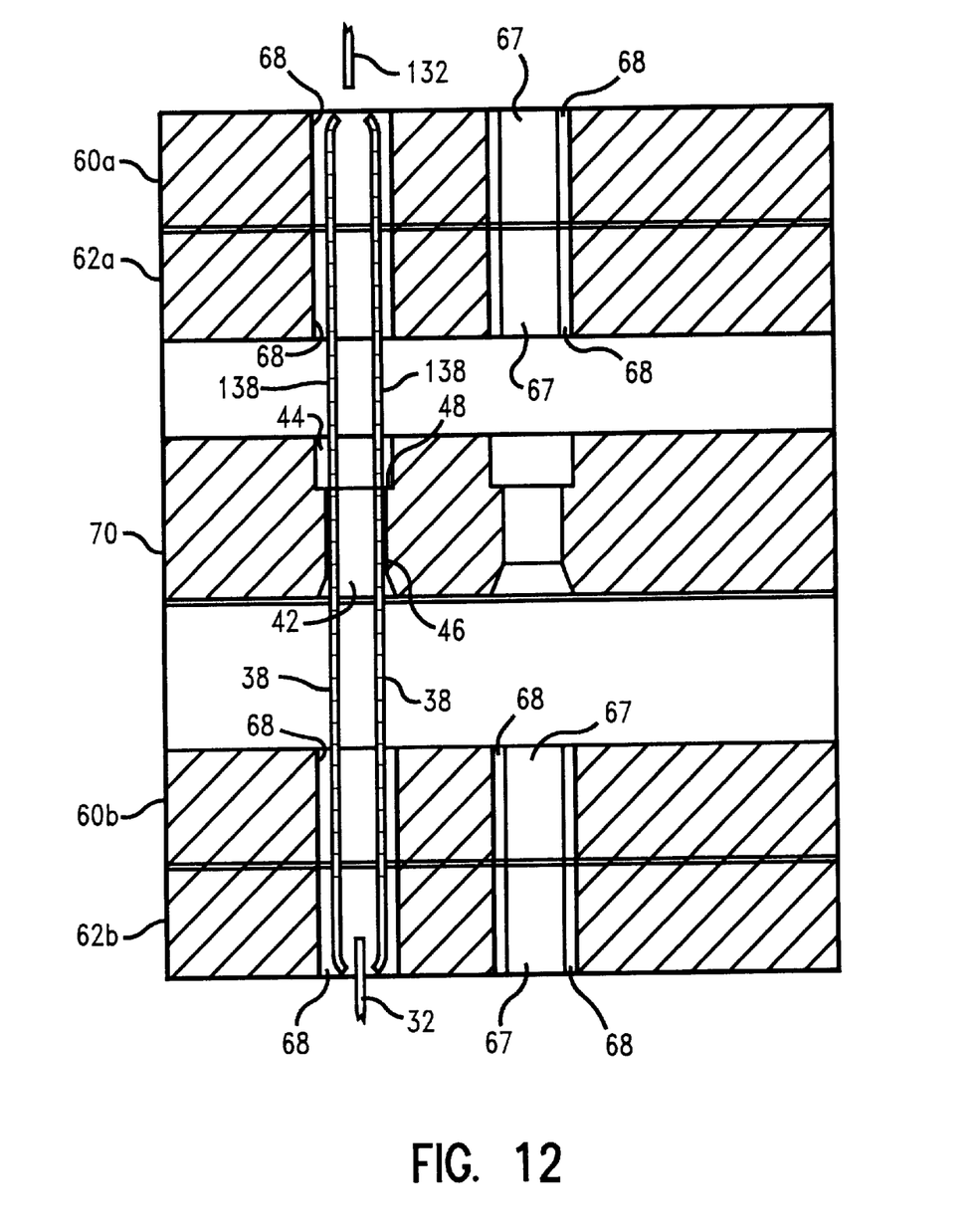
FIG. 12 is a side elevational view of the preferred ZIF connector utilized in the multistage connector assembly of FIG. 1.
Figure 13:
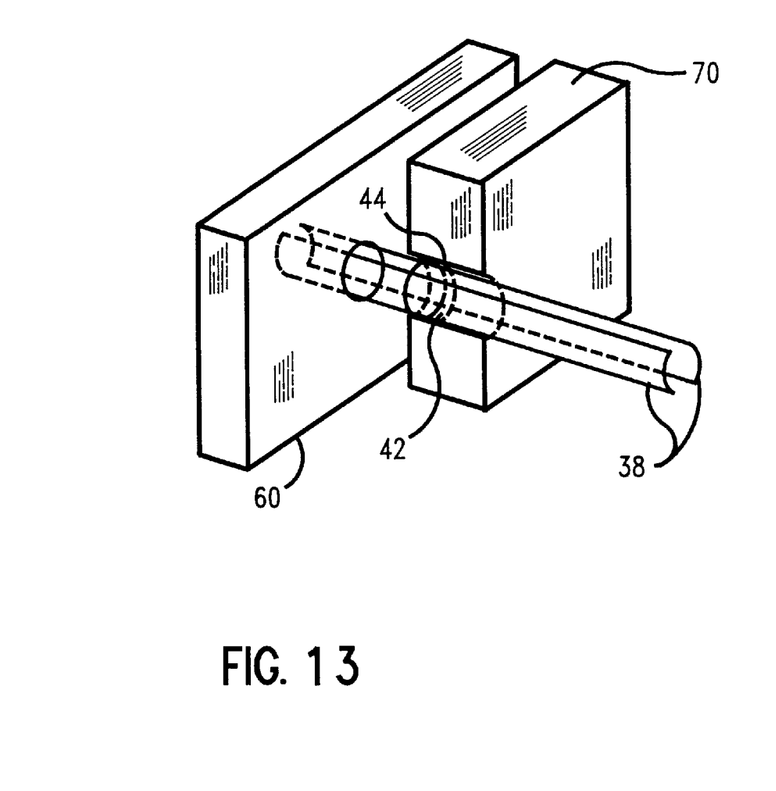
FIGS. 13 and 14 are perspective views of the positioning of the preferred ZIF connector in the holder plate in the multistage connector assembly of FIG. 1.
Figure 14:
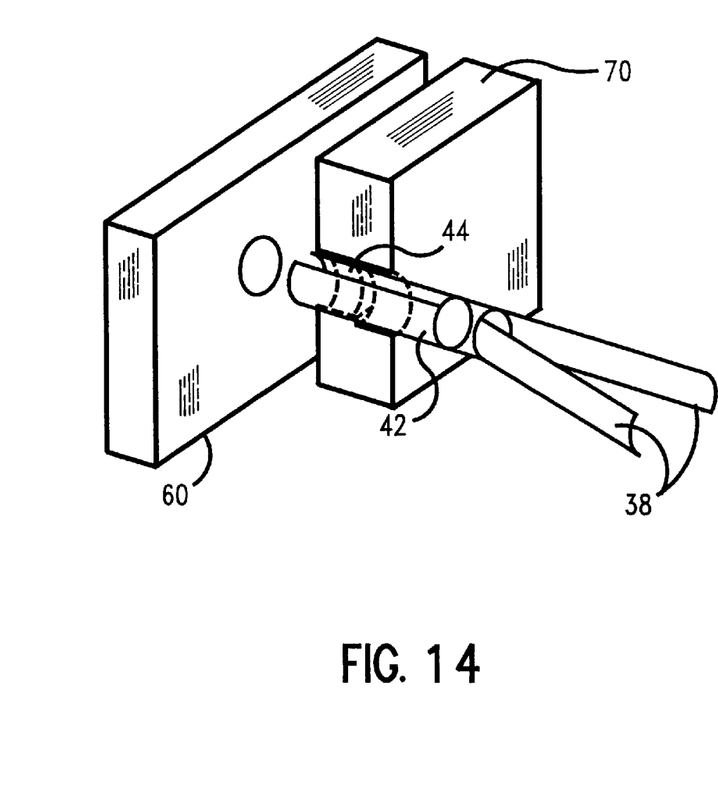

A preferred actuator plate 60 or 62 is shown in FIG. 10. Plate 60, 62 has a central opening 66 for spring tower 26 and a plurality of smaller openings 64 around the periphery corresponding to the location of the ZIF connectors. The ZIF connector leaf springs 38 pass through openings 64. The configuration of individual openings 64 is shown in FIG. 11 wherein a central circular opening 67 permits free passage of the leaf connectors 38 and a pair of opposed extended oval openings 68 provide edge contact against the individual leaves of leaf connectors to close the ZIF connector against a PGA pin.

Figure 8:
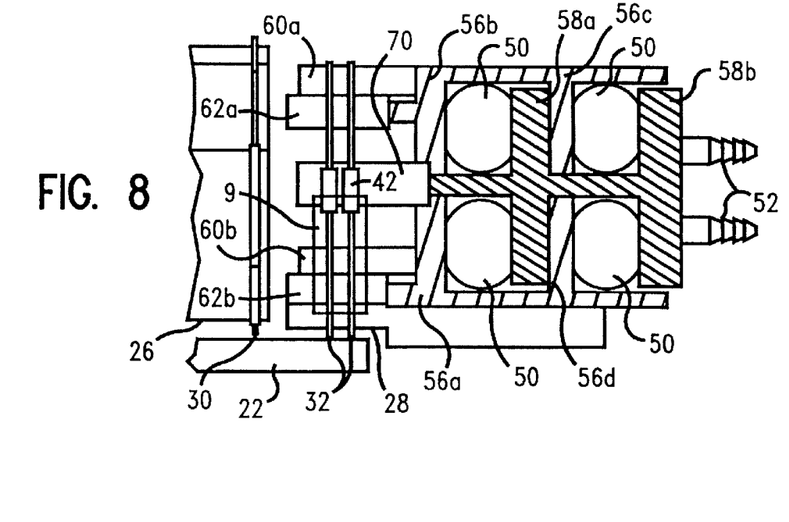
FIG. 8 is an enlarged elevational sectional view of a portion of the connector assembly of FIG. 3 showing the pin grid array and land grid array connectors to the IC circuit after actuation of the ZIF connectors.
Figure 9:
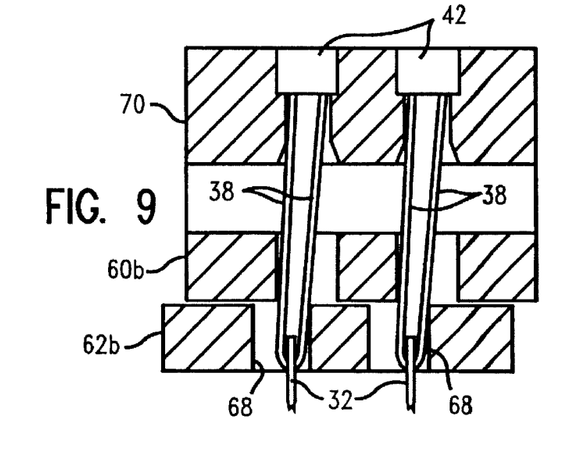
FIG. 9 is an enlarged elevational sectional view of a portion of FIG. 8 showing the ZIF and PGA connectors to the IC circuit after actuation of the ZIF connectors.

As shown in FIGS. 3, 6, 7 and 12 before the air bladders are inflated, PGA pins 32 and 132 are received without contact between the individual leaves of leaf connectors 38. Under manual or automatic control, air pressure is applied to the air bladders through the air ports, as shown in FIGS. 4, 8 and 9. As air bladders 50 become fully pressurized and expand to a larger diameter against connected stationary plates 58a, 58b, 58c and 58d, they apply force to opposing pusher plates 54a, 54b, 54c, 54d and 56a, 56b, 56c and 56d, which in turn causes the pusher plates to move laterally (normal to the direction of PGA pins 32 and 132) and coincidentally drive the actuation plates against the ZIF contacts. Pusher plates 54a and 54d are rigidly connected to actuation plate 60b, pusher plates 54b and 54c are rigidly connected to actuation plate 60a, pusher plates 56a and 56d are rigidly connected to actuation plate 62b, and pusher plates 56b and 56c are rigidly connected to actuation plate 62a. There are two independent sets of opposing actuation plates per each end of the ZIF connectors. When air bladders 50 inflate, the movement of pusher plates 60b and 62b operate to close the lower leaf connectors 38 around DUT PGA pins 32 and the movement of pusher plates 60a and 62a operate to close the upper leaf connectors 38 around load board PGA pins 132. As shown in FIGS. 3, 8 and 9, pusher plates 54a and 54d cause lower actuator plate 60b to shift laterally to the right and pusher plates 56a and 56d cause lower pusher plate 62b to shift laterally to the left so as to pinch lower leaf contacts 38 around DUT pins 32. Likewise, pusher plates 54b and 54c cause upper actuator plate 60a to shift laterally to the right and pusher plates 56b and 56c cause upper pusher plate 62a to shift laterally to the left so as to pinch upper leaf contacts 38 around load board pins 132 (see FIG. 4). In each instance, the edges of oval portions 68 of plate openings 64 directly contact the leaf spring contacts 38. The movement of the pusher plates simultaneously closes the ZIF contact leafs against the PGA pins for both the DUT and load board.

In most applications, the DUT load board side contacts would have been previously closed against the load board pins as part of the tool setup. The ZIF actuation mechanism is anchored and aligned to the DUT load board through ZIF holder plate 70. The spring tower 26 is also anchored and aligned to the DUT load board, facilitating the registration between the spring tower and the ZIF array necessary to successfully plug and make contact to the DUT.

It should be noted that the plates 28, 60a–b, 62a–b and 70 can be readily fabricated to conform to various IC carrier PGA patterns. The spring tower and spring contacts thereon can be custom designed to match the specific IC carrier LGA contact requirements, with the properties of the contact tower following suit. The overall versatility of the multistage connector is derived from the independent and isolated test connector design feature, such as LGA, within a zero insertion force production connector, such as for PGA connectors.

The modular assembly enables quick set-up, quick repairs and quick (carrier) personality upgrades. The two imbedded spring arrays can be personalized to accommodate many different carrier IO configurations. The spring array assemblies can be changed to upgrade the contact mechanism for IC carriers of different sizes. Thermal management interfaces (e.g., heatsinks, air impingement) can easily be integrated into the design by tailoring the component delivering the normal force onto the carrier.

The connector assembly of the present invention provides a versatile, durable, compact system intended to provide repeatable electrical continuity simultaneously between an IC with both PGA and LGA I/O arrays and a load board attached to a test system or any other electrical peripheral devices. The easy-to-use mechanism performs all the critical components of any IC interconnect contact, actuation, alignment, retention and release. The connector can be integrated into an automatic handler by interfacing the pneumatic controls with the automatic handler.

The multistage connector assembly provides: 1) simultaneous connection of the production I/O pins and the test connectors; 2) zero or low insertion and extraction force of the pin array on the DUT; 3) essentially no lateral movement or scrubbing of pad connectors on the DUT against the connector assembly contacts; 4) reparability of individual contacts for both the PGA and LGA parts of the socket; 5) reasonable manual actuation force for the test operator or a mechanically assisted actuation; and 6) reliability of connections within the dimensional tolerances of the circuit module.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for securing a connection between an integrated circuit module containing at least two different contacts thereon and a circuit board comprising:
   a socket for receiving first and second sets of said contacts on one side thereof, said first set of contacts being different than said second set of contacts;
   a first portion of said socket containing openings therein for said first set of contacts;
   a second portion of said socket for contacting said second set of contacts, said second portion being movable with respect to said first portion, said second portion being located in a position wherein said first set of contacts on said integrated circuit module contact the openings in said first portion before said second set of contacts on said integrated circuit module contact said second portion, said second portion being biased toward the integrated circuit module; and
   movable connectors in the openings in said first portion of said socket for releasably securing said first set of contacts in said openings, wherein said second portion of said socket maintains contact with said second set of contacts such that said first and second set of contacts on said integrated circuit module are simultaneously in contact with the respective portions of said socket.

2. The apparatus of claim 1 wherein said first portion of said socket contains openings therein for a first set of pin grid array contacts on said integrated circuit module.

3. The apparatus of claim 1 wherein said second portion of said socket contains contacts thereon for a second set of land grid array contacts on said integrated circuit module.

4. The apparatus of claim 1 wherein said socket includes a spring for biasing said second portion toward the integrated circuit module.

5. The apparatus of claim 1 wherein said first portion of said socket containing openings is disposed around said second portion of said socket.

6. The apparatus of claim 1 wherein said connectors comprise leaf connectors movable in a direction lateral to said first set of contacts to open while receiving said first set of contacts and close to secure said first set of contacts in said openings.

7. The apparatus of claim 6 further including inflatable bladders to move said leaf connectors between an open position and a closed position.

8. The apparatus of claim 7 wherein said inflatable bladders are adapted to simultaneously move said leaf connectors between said open and closed positions.

9. The apparatus of claim 1 wherein said connectors comprise zero or low insertion force connectors.

10. The apparatus of claim 1 wherein said second portion is movable in a direction toward and away from said integrated circuit module such that forces on said second set of contacts are maintained solely in the direction of movement of said second portion while said first set of contacts is maintained in said openings.

11. The apparatus of claim 1 wherein said socket has a second side opposing said one side for contact with said circuit board, said second side having: i) a third portion of said socket containing movable connectors in openings for releasably securing a set of contacts on said circuit board and ii) a fourth portion of said socket for contacting another set of contacts on said circuit board.

12. The apparatus of claim 11 wherein the movable connectors in said third portion of said socket are the same as the movable connectors in Said first portion of said socket.

13. The apparatus of claim 11 wherein said first and third portions of said socket contain openings therein for a set of pin grid array contacts on said integrated circuit module and said circuit board, respectively.

14. The apparatus of claim 11 wherein said fourth portion of said socket contains contacts secured to said circuit board.

15. The apparatus of claim 1 wherein said openings in said first portion of said socket include a shoulder and wherein said movable connectors are received in said openings such that a portion on each of said connectors abuts said shoulder, said shoulder restricting movement of the connectors completely through said openings.

16. A socket for connecting to an integrated circuit module containing pin grid array contacts and land grid array contacts thereon, said socket having a first portion containing openings therein for said pin grid array contacts and a second portion for contacting said land grid array contacts, said second portion being movable with respect to said first portion, said second portion being located in a position wherein said pin grid array contacts on said integrated circuit module are received in the openings in said first portion before said land grid array contacts on said integrated circuit module contact said second portion, said second portion being biased toward the integrated circuit module, said socket further including movable connectors in the openings in said first portion of said socket for releasably securing said pin grid array contacts, such that said pin grid array and land grid array contact on said integrated circuit module are simultaneously in contact with the respective portions of said socket.

17. The socket of claim 16 wherein said socket includes a spring for biasing said second portion toward the integrated circuit module.

18. The socket of claim 17 wherein said first portion of said socket contains openings is disposed around said second portion of said socket.

19. The socket of claim 18 wherein said connectors comprise leaf connectors movable in a direction lateral to said pin grid array contacts to open while receiving said pin grid array contacts and close to secure said pin grid array contacts in said openings.

20. The socket of claim 19 further including inflatable bladders to move said leaf connectors between an open position and a closed position.

21. The socket of claim 20 wherein said inflatable bladders are adapted to simultaneously move said leaf connectors between said open and closed positions.

22. The socket of claim 21 wherein said contacts on said second portion comprise pointed barbs.

23. The socket of claim 22 wherein said second portion is movable in a direction toward and away from said integrated circuit module such that forces on said land grid array contacts are maintained solely in the direction of movement of said second portion while said pin grid array contacts are maintained in said openings in said first portion.

24. A method of securing a connection between an integrated circuit module containing at least two different contacts thereon and a circuit board comprising:

providing an integrated circuit module having a first set of contacts and a second set of contacts, said first set of contacts being different than said second set of contacts;

providing a socket on a circuit board having a first portion containing openings therein for said first set of contacts and a second portion for contacting said second set of contacts, said second portion being movable with respect to said first portion, said second portion being located in a position wherein said first set of contacts on said integrated circuit module contact the openings in sail first portion before said second set of contacts on said integrated circuit module contact said second portion, said second portion being biased toward the integrated circuit module;

moving said integrated circuit module toward said socket to begin insertion of said first set of contacts into said openings in said first portion without permitting said second set of contacts to contact the socket second portion;

thereafter making contact between said second set of contacts on said integrated circuit module and said second portion of said socket while continuing to move said first set of contacts into said openings; and securing said first set of contacts in said openings to maintain simultaneous contact between said first and second set of contacts on said integrated circuit module and the respective portions of said socket.

25. The method of claim 24 wherein said openings in said first portion of said socket provide zero or low insertion force.

26. The method of claim 24 wherein said first portion of said socket includes leaf connectors in said openings movable in a direction lateral to said first set of contacts and including opening said leaf connectors while moving said first set of contacts and closing said leaf connectors to secure said first set of contacts in said openings.

27. The method of claim 26 wherein said socket includes inflatable bladders to move said leaf connectors between an open position and a closed position and including inflating said bladders to close said leaf connectors to secure said first set of contacts in said openings.

28. The method of claim 27 wherein said bladders are simultaneously inflated to move said leaf connectors between said open and closed positions.

* * * * *